(12) United States Patent
Giesbers et al.

(10) Patent No.: US 7,951,687 B2
(45) Date of Patent: May 31, 2011

(54) METHOD OF MANUFACTURING A FLEXIBLE ELECTRONIC DEVICE AND FLEXIBLE DEVICE

(75) Inventors: Jacobus Bernardus Giesbers, Eindhoven (NL); Monique Johanna Beenhakkers, Eindhoven (NL); Cornelis Johannus Hermanus Antonius Rijpert, Eindhoven (NL); Gerwin Hermanus Gelinck, Eindhoven (NL); Fredericus Johannes Touwslager, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 1261 days.

(21) Appl. No.: 10/551,309

(22) PCT Filed: Mar. 30, 2004

(86) PCT No.: PCT/IB2004/050357
§ 371 (c)(1),
(2), (4) Date: Sep. 28, 2005

(87) PCT Pub. No.: WO2004/088728
PCT Pub. Date: Oct. 14, 2004

(65) Prior Publication Data
US 2006/0194363 A1 Aug. 31, 2006

(30) Foreign Application Priority Data
Apr. 2, 2003 (EP) .................................... 03100879

(51) Int. Cl.
*H01L 21/46* (2006.01)

(52) U.S. Cl. ..................................... 438/458; 257/E21.6
(58) Field of Classification Search .................. 438/458, 438/118; 257/E21.6
See application file for complete search history.

(56) References Cited

U.S. PATENT DOCUMENTS

| 5,455,142 | A | 10/1995 | Takahashi et al. | |
| 6,262,833 | B1 | 7/2001 | Loxley et al. | |
| 6,506,664 | B1 * | 1/2003 | Beyne et al. | 438/455 |
| 6,762,510 | B2 * | 7/2004 | Fock et al. | 257/787 |
| 2004/0249037 | A1 * | 12/2004 | Kolbe et al. | 524/401 |
| 2006/0284169 | A1 * | 12/2006 | Park et al. | 257/40 |

FOREIGN PATENT DOCUMENTS

| EP | 0801423 A2 | 10/1997 |
| EP | 1256983 | 11/2002 |
| JP | 63017980 A | 1/1988 |
| JP | 2001-244467 A | 9/2001 |
| JP | 2002-020699 A | 1/2002 |
| JP | 2002-100782 A | 4/2002 |
| JP | 2003-069034 A | 3/2003 |
| WO | WO0120691 | 3/2001 |
| WO | WO 02/06413 A1 | 1/2002 |
| WO | WO0206413 | 1/2002 |
| WO | WO02071137 | 9/2002 |
| WO | WO 01/80286 A2 | 10/2004 |

* cited by examiner

*Primary Examiner* — David A Zarneke

(57) ABSTRACT

An electrical element, such as a thin-film transistor, is defined on a flexible substrate, in that the substrate is attached to a carrier by an adhesive layer, and is delaminated after definition of the transistor. This is for instance due to illumination by UV-radiation. An opaque coating is provided to protect any semiconductor material. A heat treatment is preferably given before application of the layers of the transistor to reduce stress in the adhesive layer.

10 Claims, 2 Drawing Sheets

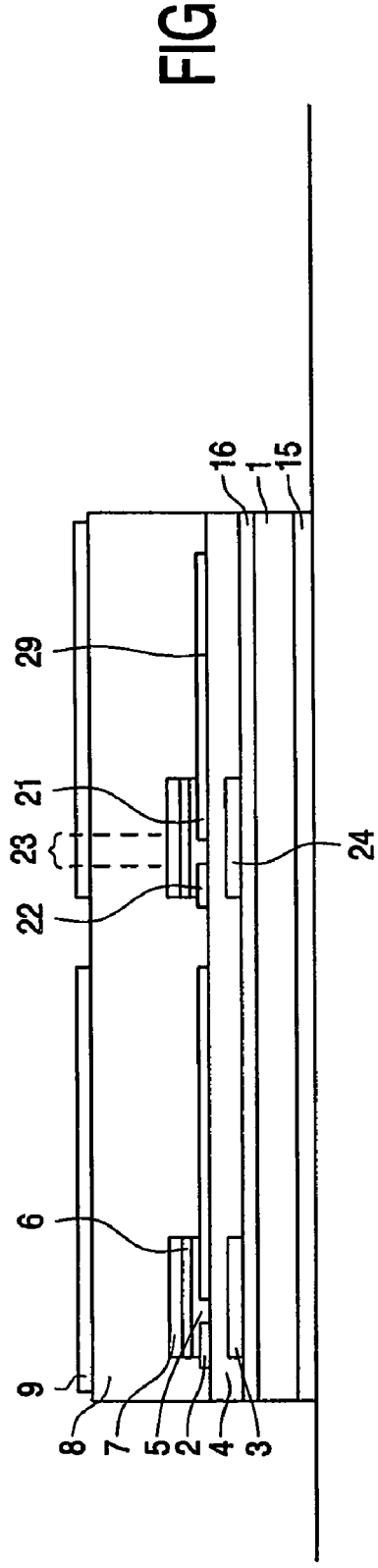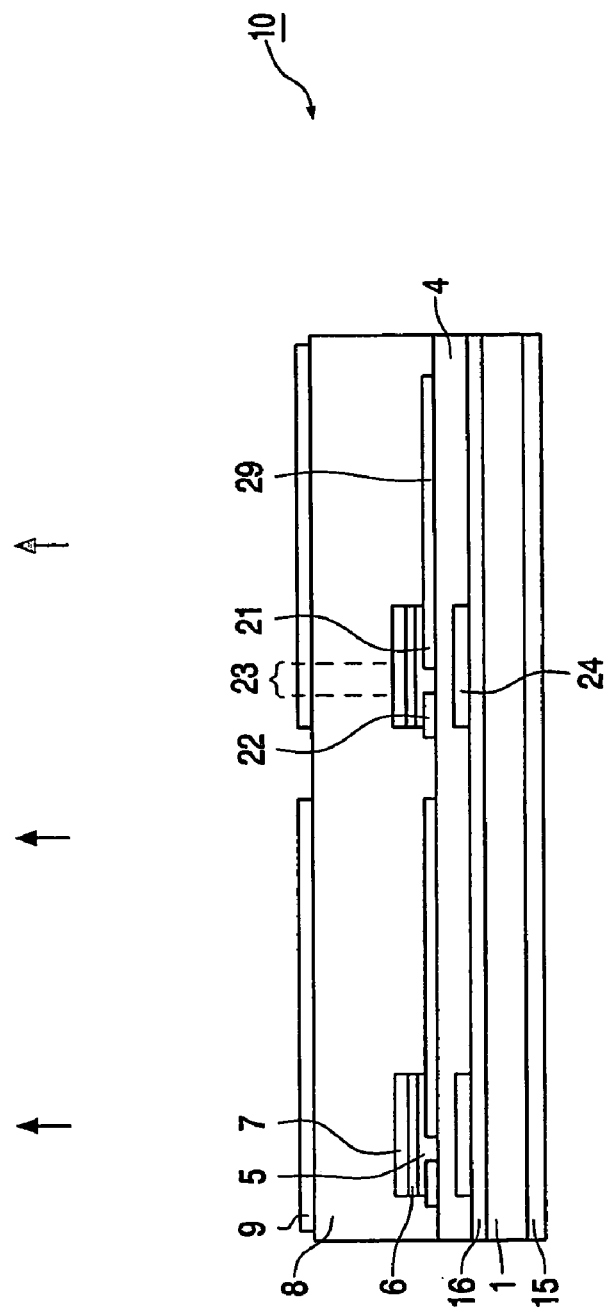

METHOD OF MANUFACTURING A FLEXIBLE ELECTRONIC DEVICE AND FLEXIBLE DEVICE

Figure 1A:
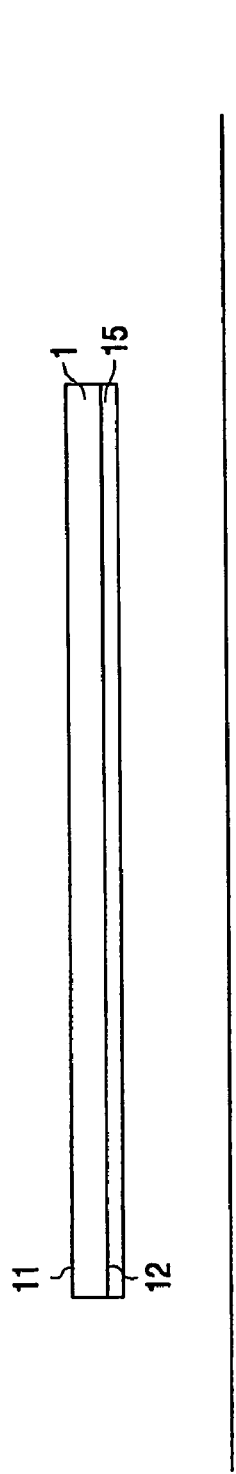

The invention relates to a method of manufacturing a flexible electronic device provided with a substrate having a first and an opposite second side and an electronic element, in which method the substrate is attached to a transparent and rigid carrier by an adhesive layer, thereby resulting in first bonds between the adhesive layer and the substrate and in second bonds between the adhesive layer and the carrier, which adhesive layer is irradiated after some process steps to enable delamination of the substrate from the carrier, thus obtaining the flexible device.

The invention also relates to a flexible electronic device comprising a substrate having a first and an opposite second side, that is at the second side provided with an electronic element.

Such a method and such a device are known from EP-A 1256983. In the known method use is made of a semiconductor substrate in which transistors are defined. In the particular example given, the semiconductor substrate is a silicon substrate with a buried insulator layer. After attaching the substrate to a temporary carrier by an adhesive layer, the substrate is removed up to the insulator layer. A polyimide coating may be applied thereafter, to protect the transistors. Finally the adhesive layer is irradiated through the transparent carrier, and the substrate as far as left with the stack of layers thereon is delaminated from the carrier.

It is a disadvantage of the known method, that the method relies on a semiconductor substrate. The use of such a substrate is not only expensive, but it also sets limits to the achievable size of the electronic device. Generally, silicon wafers have a diameter of 6 or 8 inches (15 or 20 cm), and if larger, they will be more expensive. Particularly for display applications, however, larger sizes are desired.

It is therefore a first object of the invention to provide a method of the kind mentioned in the opening paragraph, in which the use of a silicon substrate is not required.

It is a second object of the invention to provide a flexible device that can be manufactured with the method of the invention.

The first object is achieved in that the method comprises the steps of:

providing the substrate comprising organic material;

attaching the substrate with its first side to a transparent and rigid carrier by an adhesive layer, thereby resulting in a stack of carrier, adhesive layer and substrate with first bonds between the adhesive layer and the substrate and with second bonds between the adhesive layer and the carrier, which adhesive layer comprises an initiator for initiating a cross-linking reaction;

applying layers on the second side of the substrate, in which layers the thin-film electronic element is defined, initiating a cross-linking reaction in the adhesive layer, therewith modifying the strength of at least one of the first and the second bonds, and delaminating the substrate from the carrier, therewith obtaining the device.

The method of the invention results in thin-film type electronic elements, instead of the silicon-based electronic elements of the prior art. These thin-film type electronic elements are defined only after the substrate has been attached to the carrier. This imposes strict conditions on the behaviour of the adhesive layer; not only has the substrate to be substantially flat, but also is an overlay precision on a micrometer scale required. This is realized with the invention, wherein the organic material of the substrate allows better interaction, such as hydrogen bonding, bonding on the basis of Van der Waals interaction, and even chemical bonding. The cross-linking may further include polymerization of small molecules into the network formed by cross-linking. As a result, the reaction makes that less bonds become available for interaction with the carrier or the substrate, or alternatively, that some bonds are selectively strengthened.

In a first embodiment, the initiation of the reaction takes place by heating, said reaction resulting in that the first bonds between the adhesive layer and the substrate become chemical bonds. This binding to the substrate leads to a networking of the adhesive layer and the substrate together. Afterwards, the carrier can be delaminated from the adhesive layer easily. This delamination is generally achieved with gentle heating; however, it is not excluded that an additional illumination step is done to initiate the cross-linking within the adhesive layer at the side of the carrier. In the end, it has been found that the delaminated surface of the adhesive layer has lost its adhesive force. This is an important advantage for use in practice, as it means that the resulting device will not stick without reason to any carrier in further assembly. The delamination of the substrate from the carrier is then to take place at increased temperature, for instance at 50-120° C.

In a second embodiment the initiation of the reaction takes place by irradiation so as to initiate a cross-linking reaction. This cross-linking reaction is more focussed and turns out to strengthen the bonds within the adhesive layer.

Good results have been obtained with systems in which the adhesive layer is based on acrylates and the carrier has a glass surface or a glass-like surface. Such acrylate-based adhesives are mixtures of polyacid with acrylate monomers and oligomers by preference. The monomers, that may well diffuse through the adhesive layer and be present between polymeric chains and the substrate, will allow a uniform bonding. The glass layer at the carrier may be bound to the adhesive layer with hydrogen bonds.

It is herewith particularly suitable that the substrates of organic material, particularly polymeric sheets, are provided with nitrogen or oxygen groups, and particularly with carboxyl ($C=O$) groups. Such groups allow many chemical interactions and reactions with the acrylate based adhesive layer.

In a preferred modification of the second embodiment with irradiation, one of the layers of the thin-film element is an active layer of semiconductor material, this active layer being protected from the adhesive layer through an opaque coating. With this opaque coating the active layer of semiconductor material is protected effectively against the UV-radiation.

In a further embodiment, the carrier and the substrate are given after lamination a heat treatment to a temperature of at least a process temperature of any layer to be applied and at most a degradation temperature of the adhesive layer. For many applications the temperature stability of the adhesive layer must be very good; e.g. the original sizes must still be retained after several heating and cooling steps, such as are necessary for the patterning and/or the deposition of the layers in which the thin film element is defined. It is not always the case that the temperature stability is good enough without any additional measures. The heat treatment of this embodiment is such additional measure. As a result thereof, the stack of adhesive layer and substrate will expand or shrink as it will do afterwards. It was found that with such a heat treatment the adhesive layer gets the required temperature stability, and the layers can be applied with an overlay precision in the order of micrometers or less.

The heat treatment is preferably done at a temperature of 80-150° C. during 5-30 minutes, and by further preference at 120-140° C. during 10-20 minutes. The higher the temperature used, the shorter the heating time. Heating too much would result in desintegration of the initiator and thus to initiation of polymerisation.

The necessity for the overlay precision is particularly present in the case where the electronic element is a transistor, and more particularly for transistors to be used in displays. In such transistors, the gate electrode should overlay channel and source- and drain-electrodes as precisely as possible. If the gate electrode is displaced towards the source electrode or in the opposite direction towards the drain electrode, the parasitic capacitance between gate and source or drain is increased. This influences the transistor performance and the display quality. A further negative effect is that the variation in transistor performance increases. If the gate electrode is displaced in a direction transversally oriented thereto, a leakage current may result, giving rise to non-functioning of the transistor. The problem is particularly pertinent, since with uncontrolled expansion of the adhesive layer and substrate, the overlay will be different at the edges of the structure than in the center thereof. In contrast, these strict conditions are not necessary in the prior art, wherein the carrier is only attached to the substrate after the transistors have been defined.

Furthermore, the surface of the substrate should be planar before applying any of the functional layers, which generally have a thickness in the submicrometer range. A planarisation layer may be applied on top of the substrate for this reason. However, particularly if the substrate and the adhesive layer are applied onto the carrier together, this will not be necessary anyway. Besides, any planarisation layer increases the thickness with the result of reduced flexibility.

The selective weakening of one of the first and the second bonds is necessary for the adhesive layer not to be prone to be torn apart during delamination. Such selective weakening generally takes place at the interface between the carrier and the adhesive layer, because the intensity of the radiation is the highest at the interface. The adhesive layer will then adhere to the substrate after delamination, and can be used as a mechanical protection layer.

The selective weakening can be improved but also set by various means, for instance surface treatments to strengthen the first bonds and weaken the second bonds. A preferred alternative hereto, is that the adhesive layer comprises dyes. Such dyes will lead to the fact that more radiation is received near the interface of carrier and adhesive layer than near the interface of adhesive layer and substrate. A preferred embodiment of a dye is a photosensitive component. The use of the proper photosensitive component has the additional advantage that it also leads to cross-linking in the adhesive layer. With such cross-linking the adhesive layer becomes more rigid, which coincides with less adhesive strength.

The adhesive layer may contain various materials. It preferably comprises reactive additives that upon illumination with UV radiation increase the glass transition temperature of the primary polymer component in the adhesive layer. Particularly, the additives may lead to cross-lining between polymer chains, thereby forming a polymer network with an increased glass transition temperature. In the glassy state the adhesion strength of the adhesive layer is considerably reduced, thus enabling easy delamination. The glass transition temperature may be increased to room temperature. A suitable composition for the adhesive layer is known per se from WO-A 02/06413. This document describes the use of this composition as a tape for dicing a silicon wafer. Herein, the interactions with the silicon substrate and with the carrier are very different.

Low molecular additives are preferably used as additives. A preferred additive is an (meth)acrylate-type compound. This may for instance be used together with any acrylic acid. Alternatively, such additives may be present in polymeric form.

Preferably, the adhesive layer has a thickness in the range from 5-40 micrometers. Such a limited thickness reduces shear displacements. Hence, the alignment of the various layers is improved, and the overlay precision of the layers can be obtained within the specification of the transistor. Furthermore, if the adhesive layer adheres to the substrate after delamination, a limited thickness of the layer is important in order to provide the required flexibility.

The protective means for the active layer is a reflective layer in particular. Such a reflective layer may be present in the substrate. Suitable reflective layers include a stack of silicon nitride and silicon oxide, and metal films. The reflective layer may be a stack of a plurality of sublayers. The reflective layer and the wavelength of radiation to irradiate the adhesive layer can be mutually optimized. An advantage of the reflective layer is that it will protect the thin-film element against degradation through oxygen and water as well. A further advantage of the reflective layer is that the dose of irradiation can be reduced by about 50%. Alternatively, or in addition thereto, one of the functional layers, such as an electrode layer of Au, acts as protective layer.

In an advantageous embodiment, the thin-film electronic element is a thin-film transistor provided with a source and a drain electrode mutually separated through a channel and a metallic gate electrode separated from the channel through a gate dielectric, wherein the metallic gate electrode acts as the opaque coating. Such a thin-film transistor has a what is called bottom gate structure. The gate electrode, preferably of gold, will herein protect the semiconductor material from the radiation to be used for chemically modifying the adhesive layer or part thereof.

The semiconductor material used in the element of the invention may be any semiconductor material such as amorphous or polycrystalline silicon, zinc sulphide or other inorganic semiconductor material, nanostructures such as nanowires and nanotubes of semiconductor material, including carbon, and organic semiconductors, including herein also organic semiconductor materials used in light-emitting diodes. Particularly preferred is the use of an organic semiconductor material in transistors. Herewith a device can be made that is not just flexible, but even rollable and able to be integrated in paper. Organic semiconductor materials are for instance polyphenylene-vinylenes, polyfluorenes, oligothiophenes, pentacene, fullerene, polyarylamines, polythiophenes, polythienylene-vinylenes, which materials may be provided with alkyl-, alkoxy-, aryl-aryloxy-side chains or other side chains. Furthermore, such materials may be copolymers and blends, including copolymers of semiconducting oligomers with non-semiconducting monomers.

The adhesive layer can be provided on the substrate before laminating both to the carrier. This is interesting in that the stack of substrate and adhesive layer will be commercially available. However, the adhesive layer and the substrate must be able to withstand the required process temperatures. It may therefore be preferred to provide an optimized adhesive layer by spin-coating. The substrate may thereafter be provided by laminating, but alternatively by spincoating.

The process temperatures used in the application of the further layers will determine the temperature given in the heat treatment. Higher temperatures are for instance necessary to bake photoresists, if any, to convert a precursor material into an organic semiconductor material, if present, to provide the electrically conductive layers, to enable electrical contact between the semiconductor material and the electrodes, and to provide any electro-optical layer. Such an electro-optical layer can be provided on top of the transistors, with preferably a protective and/or a planarizing layer in between the transistor and the electro-optical layer. The required process temperatures are generally in the range from 100 to 200° C.

The radiation is preferably radiation of the UV-spectrum, for instance with a wavelength between 250 and 400 nm. It may be provided as a low-intensity radiation, for instance of 1-100 mW/cm$^2$, preferably 5-40 mW/cm$^2$, so as to prevent negative impact on any of the functional layers in the device.

The second object is achieved in a flexible electronic device comprising a substrate having a first and an opposite second side, that is on the first side provided with an adhesive layer having a surface substantially without adhesive strength, and is provided on the second side with a thin-film electronic element. This flexible electronic device results when the second bonds are weakened and the device is delaminated from the carrier with the adhesive layer adhered to the substrate.

The electronic element is preferably a transistor. More preferably a plurality of transistors and an electro-optical layer are present, thereby constituting a display, at least part of which transistors functioning as pixel transistors of the display. As the manufacture of the electronic element is not limited to the size of a semiconductor wafer, very large flexible displays, with 12, 15 or 20 inch diameter, can be realized. Such transistors may include an organic semiconductor material, which allows the manufacture of rollable displays.

The adhesive layer suitably comprises a polymer network. Such a polymer network will have developed as a consequence of irradiation, if certain compounds are present. It is advantageous in that herewith the adhesive layer—and thus the device—is provided with a somewhat more rigid surface. Such a surface is less prone to mechanical damage.

These and other aspects of the invention will be further explained with reference to the Figures, which are purely diagrammatical and not drawn to scale, and in which the same reference numbers refer to the same or equivalent parts, and in which:

FIG. 1A-D show cross-sectional views of several stages in the method of the invention.

FIG. 1A shows a transparent and rigid carrier 20, which is made of glass in a thickness of 1 cm. Its surface is well cleaned in conventional manner. The Figure further shows a substrate 1 with a first side 11 and a second side 12. The substrate 1 is provided on its second side 12 with an adhesive layer 15. The substrate 1 and the adhesive layer 15 are provided in a roll and commercially available per se, from Ultron, or from Teijin (type DT120 B60). The substrate 1 comprises for instance polyvinylchloride or polyethyleneterephtalate (PET), polyethylene naphtalate or polyimide, and has in one example a thickness of 120 micrometers. The adhesive layer 15 comprises for instance a copolymer of acrylic acids and has a thickness of 15 micrometers. Dialkylphtalate is present as a plasticizer in the adhesive layer. It further comprises a photoinitiator, which acts as dye as well. Suitable examples of photoinitiators include benzophenone, 4,4'-bis(dimethylamino)benzophenone, 2-ethylanthraquinone and benzoin ethers. Suitable photoinitiators and suitable adhesives are known per se from U.S. Pat. No. 5,455,142, which is herein included by reference. In between the substrate 1 and the adhesive layer 15 reflective layer of Al can be provided in a suitable thickness from 100-300 nm.

Figure 1B:
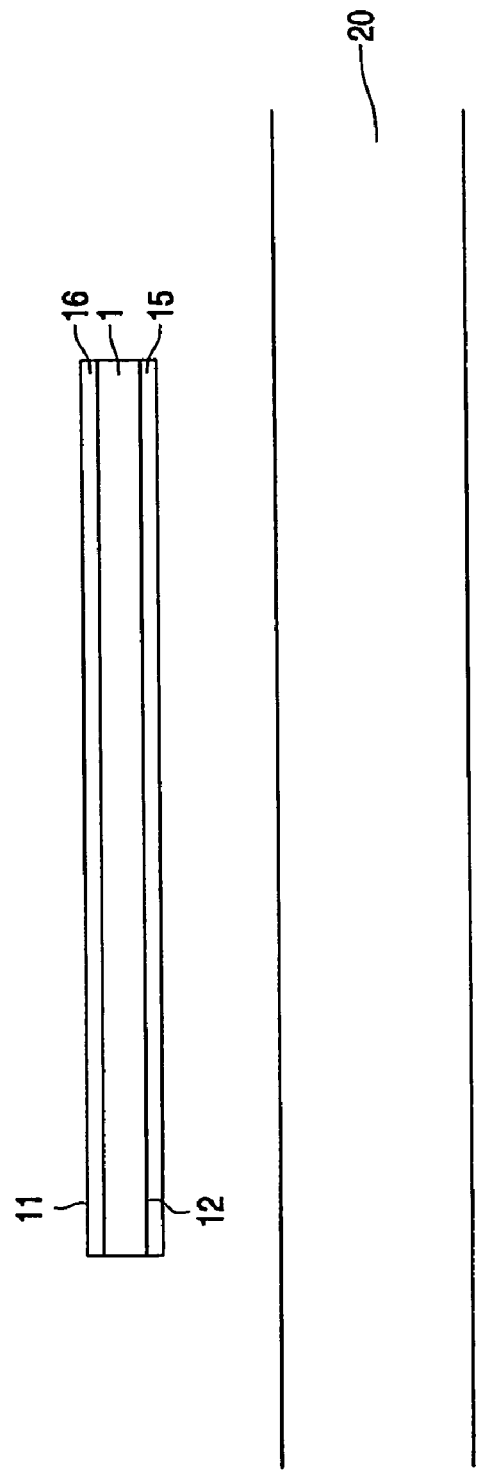

FIG. 1B shows the carrier 20 and the substrate 1 after adhesion of the adhesive layer 15 to the carrier 20. Herewith second bonds between the adhesive layer 15 and the carrier 20 have been formed. The combination of a glass carrier and a hydroxyl-groups containing adhesive, such as an acrylate-based adhesive is advantageous in that the hydroxylgroups can easily form bonds with the glass network. First bonds between the adhesive layer 15 and the substrate 1 have been formed before. However, this prior formation of the first bonds is certainly not essential. After this adhesion, a heat treatment is done at 130° C. for about 10 minutes, and cooling down to room temperature quietly takes place after that. Hereafter, the substrate 1 is given an oxid plasma treatment to make its first side 11 hydrophilic, after which a suitable planarisation layer is provided, for instance a photoresist layer such as SU8, HPR504, or benzocyclobutene, SiLK, polyvinylphenol. In this case, a solution of polyvinylphenol (Polysciences Inc, cat 6527) and hexamethoxymetylenemelamine (Cymel 300 from Cyanamid) in propylene glycol methyl ether acetate (Aldrich) was spincoated (3 s/500 rpm, 27 s/2000 rpm) and then dried at 110° C. for 1 min on a hot plate. Cross-linking at 125° C. in a nitrogen atmosphere containing 5% v/v HCl for 5 min affords a 1.5 micron thick cross-linked polyvinylphenol film.

FIG. 1C shows the result after the functional layers of the electronic components have been provided. In this case the electronic elements are transistors, which are used as pixel transistors for driving a display. A suitable electro-optical layer is an electrophoretic layer containing micro-capsules, such as known per se from U.S. Pat. No. 6,262,833. The display comprises a plurality of pixels and pixel electrodes, for instance 400, and arranged in a matrix, to drive them according to active matrix principles, such as known from WO02/71137.

The transistor comprises a source electrode 21 and a drain electrode 22, which electrodes are mutually separated through a channel 23 and are defined in a first electrode layer of electrically conductive material 2. The source-electrode 21 is connected to the pixel electrode 29. A second electrode layer 3 of electrically conductive material is present on this side 11 of the substrate 1 as well. A gate electrode 24 has been defined in this second electrode layer 3. A perpendicular projection of this gate electrode 24 on the first electrode layer 2 shows a substantial overlap with the channel 23. Furthermore are present an intermediate layer 4 of dielectric material and an active layer 5 comprising a semiconductor material.

Said layers 2,3,4 and 5 are present on the substrate 1 in the order of second electrode layer 3, intermediate layer 4, first electrode layer 2 and active layer 5. The second electrode layer 3 comprises Au and has been patterned photolithographically in conventional manner with a photosensitive resist material. After irradiation the photoresist material was heated to about 120° C. and afterwards wet-chemically etched. A monolayer of $CH_3$—$(CH_2)_{15}$—SH (not shown) may be applied between the second electrode layer 3 and the intermediate layer 4 to prevent the existence of pinholes in the intermediate layer 4. The intermediate layer 4 comprises an organic dielectric that can be structured photochemically, such as for instance benzocyclobutene, polyimide, polyvinylfenol or a photoresist, and in this case the commercially available photoresist material HPR504. It has a thickness in the order of 200-500 nm and is provided with contact holes so as to provide vertical interconnects from the first to the second electrode layer 2,3. The first electrode layer 2 comprises gold in this case and is provided with sputtering and structured photolithographically in conventional manner. Alternatively, it may contain a polymeric conductor, such as poly(3,4-ethylene)dioxythiophene (PEDOT) together with a polyacid. Such a polymeric conductor can be structured by adding a photoinitiator, such as described in WO-A 01/20691, while the conductivity is maintained. The first or the second electrode layer 2,3 further comprises contacts for external contacting (not shown), as well as interconnect lines. The active layer 5 comprises pentacene and polystyrene (99 to 1% by weight), wherein the polystyrene acts as carrier material. The pentacene was converted from precursor pentacene having a tetrachlorocyclohexadiene leaving group after application as active layer on the substrate. The conversion took place at 180° C. for three minutes. On the active layer 5 is present a protective layer 6 of electrically insulating material, as well as a photoresist 7. The layers 5, 6 and 7 form a stack and are provided with one and the same pattern.

Hereafter an electro-optical layer 8 is provided. This layer may be provided by printing or coating. It comprises a contrast media phase, which is preferably an encapsulated electrophoretic phase, and further known from U.S. Pat. No. 6,262,833. It further comprises a polymeric binding phase. Such a binding phase is preferably water-soluble and chosen from the group of polysaccharides, polyvinylalcohols, polyhydroxyalkylacrylates, polyacrylates, polyesters and polycarbonates. After application of the layer it is dried at 60-80° C. for about 30 minutes. On top of the electo-optical layer 8 a third electrode layer 9 is provided. The third electrode layer comprises transparent electrodes and is made of Indium Tin Oxide, or preferably of a polymeric conductor, such as PEDOT.

FIG. 1D shows the resulting flexible device 10, after that the carrier 20 has been delaminated from the substrate 1. Hereto, the adhesive layer 15 is irradiated through the substrate with UV-radiation of 250400 nm at an intensity of 10 mW/cm² for 30 minutes. As a result of the second electrode layer 3 acting as protective layer no negative impact on the active layer 5 has been found to occur. After the irradiation, which is presumed to result in cross-linking the adhesive layer 15 has substantially lost its adhesive strength.

EXAMPLE 1

An adhesive is prepared on the basis of ethyl lactate, in which are present 20 wt % Poly(vinyl acetate-co-crotonic acid), 30 wt % dipentaerythritol penta/hexa acrylate, 4.5 wt % 2-hydroxyethyl acrylate, 0.3 wt % Irgacure 651. This adhesive is spin coated on a glass substrate (3 s 500 rpm+30 s 1000 rpm) and dried at 90° C. for 3 minutes on a hot plate. The stack is heated to 200° C. in a convection oven followed by slow cooling to 100° C. After this a 30 μm polyimide foil is laminated at room temperature. After this layers are provided to obtain a transistor, as explained above with reference to the FIG. 1C. Use is made of gold for the first and the second electrode layers 2,3. The misalignment of the first and second gold layer is within the specification (<2.5 μm). Subsequently, the adhesive strength of the adhesive can be reduced by illuminating the adhesive through the glass substrate (dose 300 mJ/cm² @ 365 μm). The transistor stack is then removed from the underlying glass substrate.

EXAMPLE 2

An adhesive is prepared on the basis of a mixture of 20% poly(vinyl acetate-co-crotonic acid) (I), 30% dipentaerythritol penta/hexa acrylate (III), 4.5% 2-hydroxyethylacrylate (III), 0.3% the photochemical initiator Irgacure 651 (IV) and 55.2% ethyllactate. The formulas of the individual components are shown hereunder. The percentages are mass percentages. This adhesive is spin coated on a glass substrate (3 s 500 rpm+30 s 1000 rpm) and dried at 90° C. for 3 minutes on a hot plate. The stack is heated to 200° C. in a convection oven followed by slow cooling to 100° C. After this a 30 μm polyimide foil is laminated at room temperature. After this layers are provided to obtain a transistor, as explained above with reference to the FIG. 1C. Use is made of gold for the first and the second electrode layers 2,3. The misalignment of the first and second gold layer is within the specification (<2.5 μm). Subsequently, the stack is heated on a hot plate to at least 60° C., or another temperature in the range from 60 to 100° C. The transistor stack is then removed from the underlying glass substrate, and the adhesive layer is left behind at the foil.

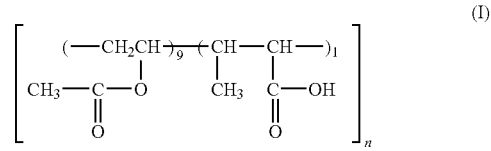

(I)

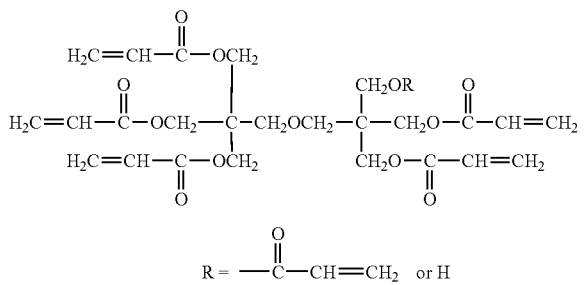

(II)

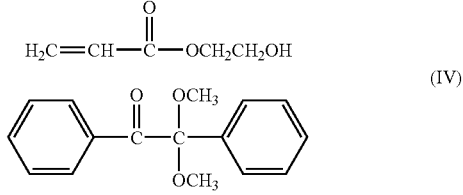

(III)

(IV)

The invention claimed is:

1. A method of manufacturing a flexible electronic device provided with a substrate having a first and an opposite second side and a thin-film electronic element, which method comprises the steps of:
   providing the substrate comprising organic material;
   attaching the substrate with its first side to a transparent and rigid carrier by an adhesive layer, thereby resulting in a stack of carrier, adhesive layer and substrate with first bonds between the adhesive layer and the substrate and with second bonds between the adhesive layer and the carrier, which adhesive layer comprises an initiator for initiating a cross-linking reaction;
   applying layers on the second side of the substrate, in which layers the thin-film electronic element is defined,
   initiating the cross-linking reaction in the adhesive layer, therewith modifying the strength of at least one of the first and the second bonds, and
   delaminating the substrate from the carrier, therewith obtaining the device.

2. A method as claimed in claim 1, wherein the initiation of the reaction takes place by heating, said reaction resulting in that the first bonds between the adhesive layer and the substrate become chemical bonds.

3. A method as claimed in claim 1, wherein the initiation of the reaction takes place by irradiation so as to initiate a cross-linking reaction.

4. A method as claimed in claim 3, characterized in that one of the layers being an active layer of semiconductor material, this active layer being protected from the adhesive layer through an opaque coating.

5. A method as claimed in claim 3, wherein a heat treatment is given to the carrier and substrate after lamination, in which heat treatment the temperature is raised to a temperature of at least a process temperature of any layer to be applied and at most a degradation temperature of the adhesive layer.

6. A method as claimed in claim 1, wherein the adhesive layer comprises acrylate and acid groups that are coupled in the polymerisation or cross-linking reaction.

7. A method as claimed in claim 1, wherein the carrier comprises a surface of glass or a glass-like material.

8. A method as claimed in claim 1, wherein the adhesive layers comprises at least one dye.

9. A method as claimed in claim 3, wherein the adhesive layer comprises a main polymeric component and a UV-sensitive reactive additive, which upon illumination with UV radiation will increase the glass transition temperature of the polymeric component.

10. A method as claimed in claim 1, wherein the thin-film electronic element is a thin-film transistor provided with a source and a drain electrode mutually separated through a channel and a metallic gate electrode separated from the channel through a gate dielectric, wherein the metallic gate electrode acts as the opaque coating.

* * * * *